United States Patent [19]
Okada

[11] Patent Number: 5,295,117
[45] Date of Patent: Mar. 15, 1994

[54] SEMICONDUCTOR MEMORY DEVICE AND METHOD FOR CONTROLLING AN OUTPUT BUFFER UTILIZING AN ADDRESS TRANSITION DETECTOR

[75] Inventor: Yoshio Okada, Tokyo, Japan
[73] Assignee: Kabushiki Kaisha Toshiba, Tokyo, Japan
[21] Appl. No.: 884,276
[22] Filed: May 13, 1992

Related U.S. Application Data
[63] Continuation of Ser. No. 579,024, May 4, 1990, abandoned.

[30] Foreign Application Priority Data
Jun. 8, 1989 [JP] Japan ................. 1-146518

[51] Int. Cl.⁵ .................. G11C 7/02; G11C 11/34
[52] U.S. Cl. .................. 365/233.5; 365/189.05
[58] Field of Search ............. 365/189.05, 233, 233.5

[56] References Cited
U.S. PATENT DOCUMENTS
| | | | |
|---|---|---|---|
| 4,272,832 | 6/1981 | Ito | 365/233.5 |
| 4,480,321 | 10/1984 | Aoyama | 365/233.5 |
| 4,573,147 | 2/1986 | Aoyama et al. | 365/233.5 |
| 4,707,809 | 11/1987 | Ando | 365/233.5 |
| 4,947,374 | 8/1990 | Wada et al. | 265/233.5 |

FOREIGN PATENT DOCUMENTS
0005493 1/1986 Japan ............. 365/233.5

*Primary Examiner*—Glenn Gossage
*Attorney, Agent, or Firm*—Banner, Birch, McKie & Beckett

[57] ABSTRACT

When data read out from a memory cell array is output to an external device through an output buffer, a first and a second address transition detector generate a first read control pulse signal and a second read control pulse signal in response to a change in an address signal. An operation for reading out data is controlled using the first and second read control pulse signals, such that when noise generated by a change in power source potential, due to a change in output, causes a possible detected change in the address signal, the first and second address transition detectors control the output buffer so erroneous operation is prevented.

9 Claims, 8 Drawing Sheets

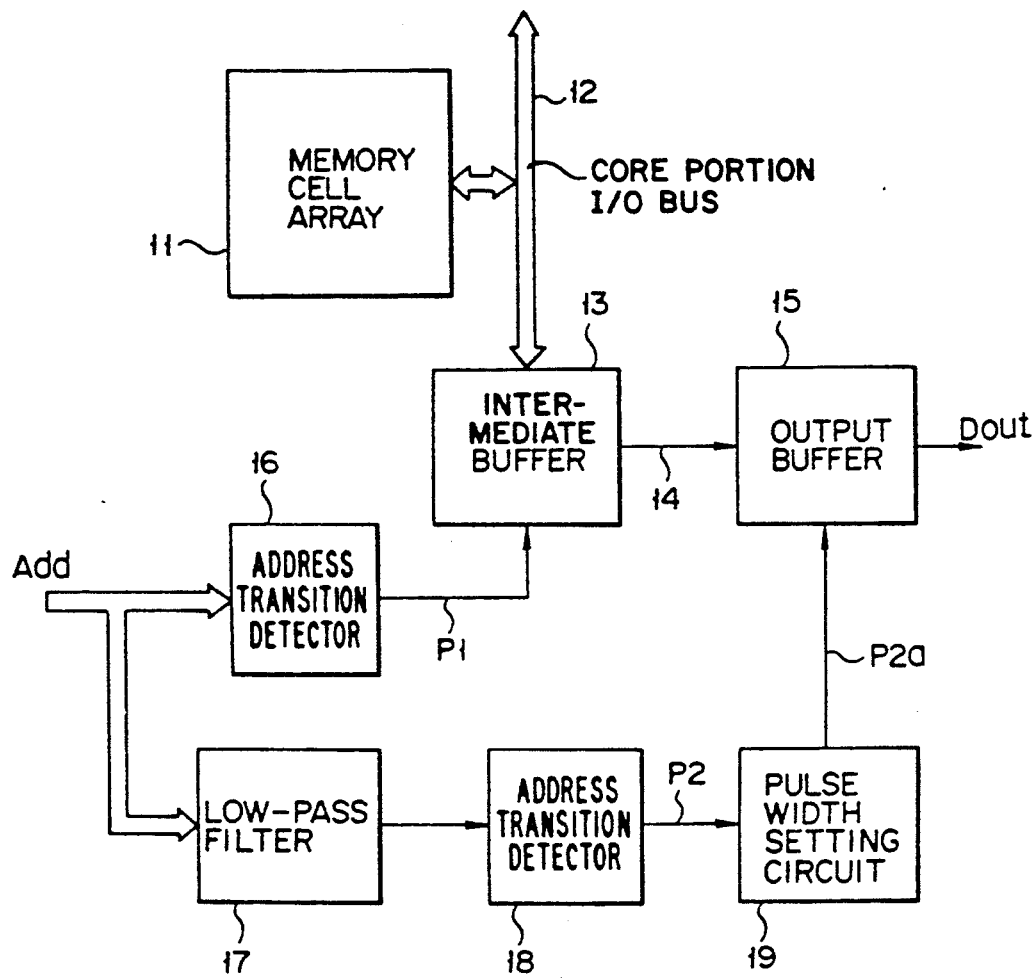
F I G. 5

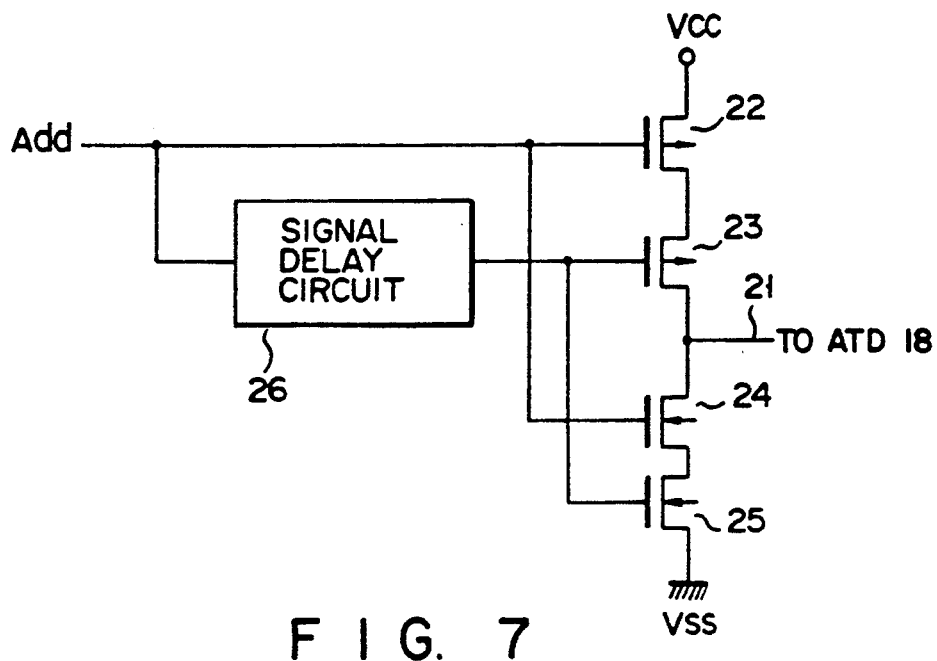
F I G. 7
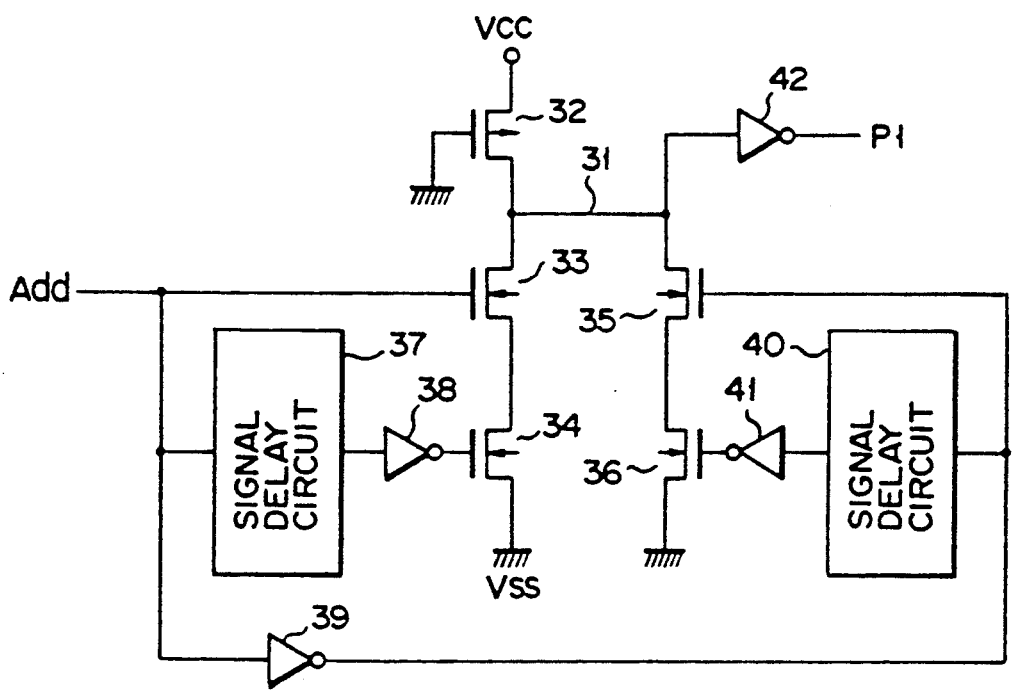
F I G. 8

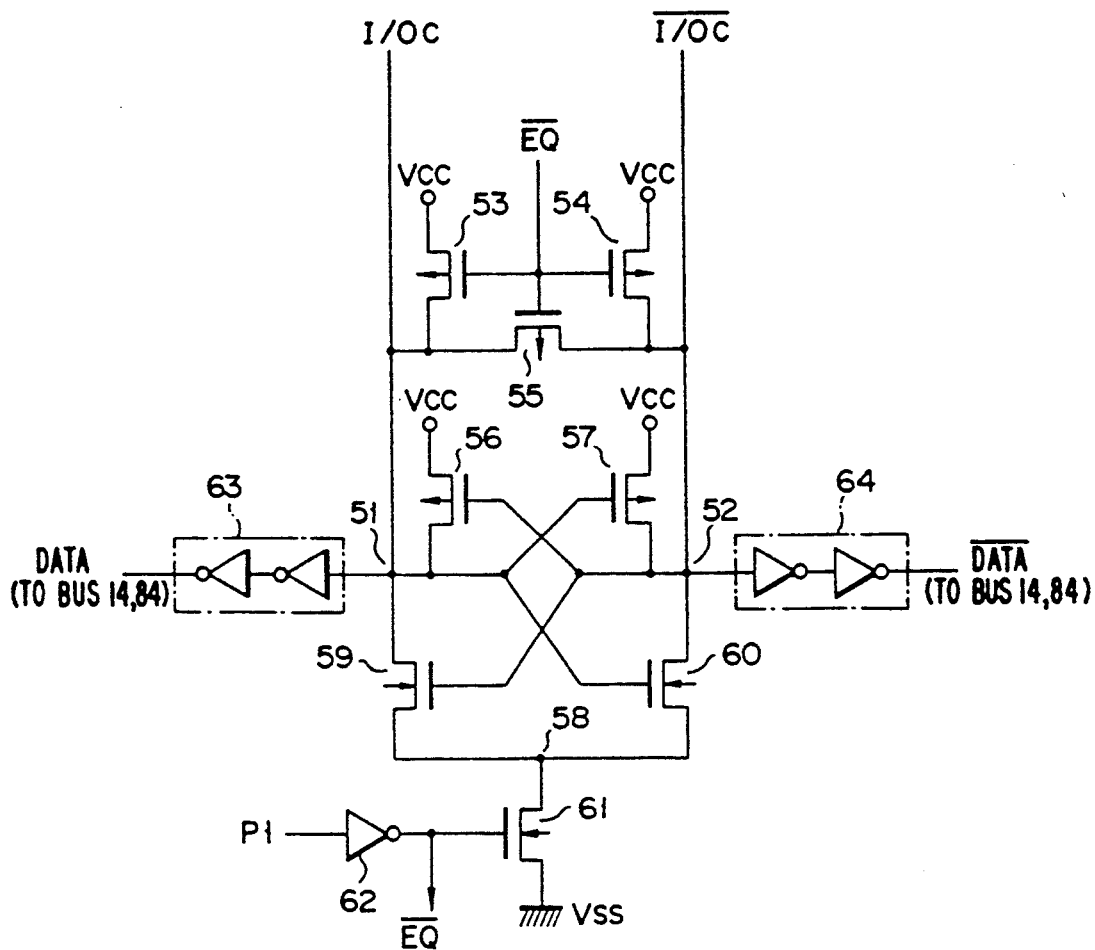
F I G. 9

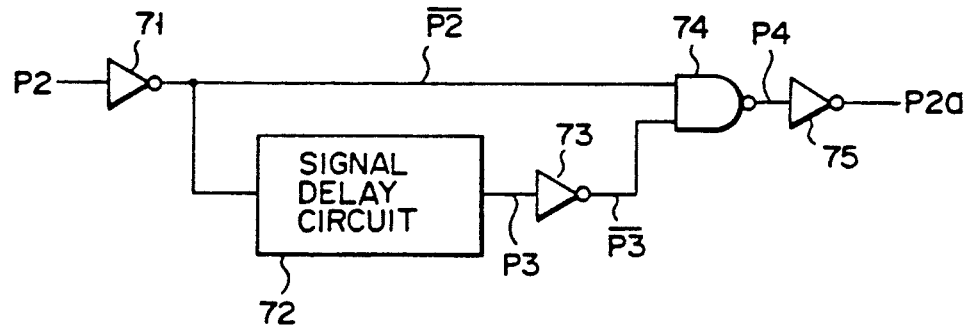
F I G. 10
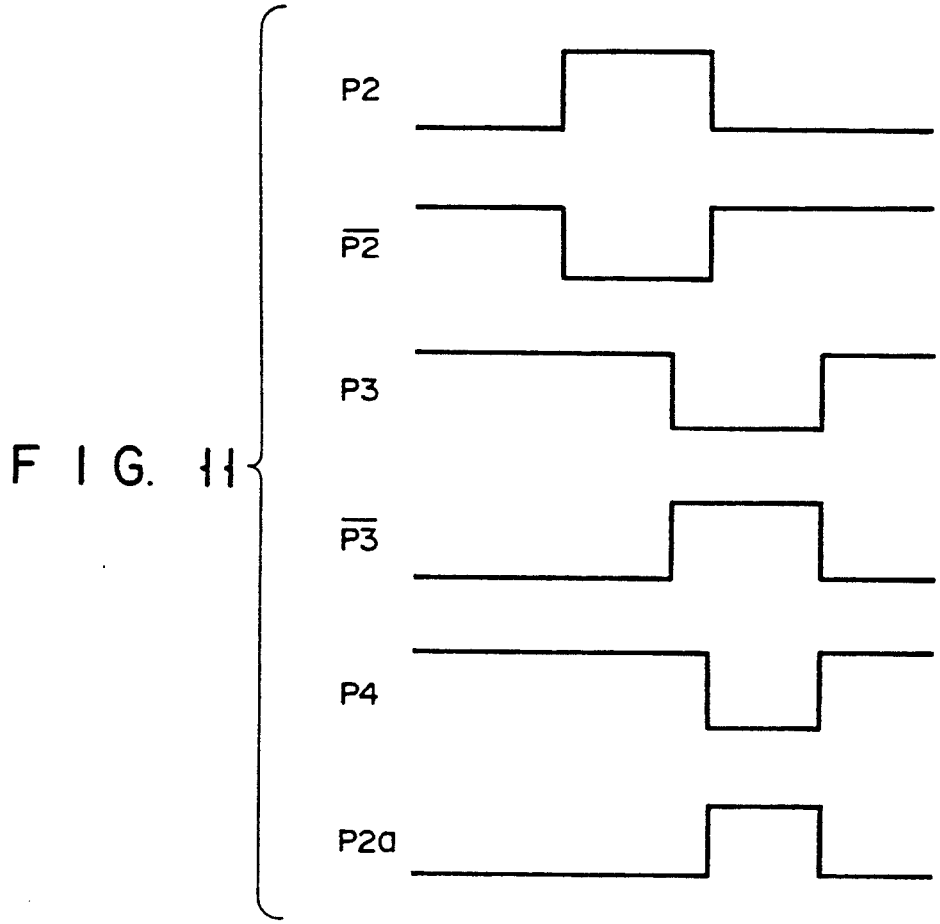
F I G. 11

SEMICONDUCTOR MEMORY DEVICE AND METHOD FOR CONTROLLING AN OUTPUT BUFFER UTILIZING AN ADDRESS TRANSITION DETECTOR

This application is a continuation of application Ser. No. 07/519,024, filed May 4, 1990, now abandoned.

BACKGROUND OF THE INVENTION

Field of the Invention

The present invention relates to a semiconductor memory device which detects a change of state in an address signal, generates a pulse signal and controls the output of data on the basis of this pulse signal.

Description of the Related Art

In a static semiconductor memory device or a dynamic semiconductor memory device having a static column mode, an address transition detector (ATD) detects a change in an address signal causing a pulse signal to be generated, which controls the transmission of data read out from a memory cell array.

FIG. 1 is a block circuit diagram showing a schematic arrangement of a readout portion in a conventional semiconductor memory device having an ATD 86, and FIG. 2 is a timing chart showing operation of the memory device. Data read out from a memory cell array 81 is supplied to an intermediate buffer 83 through a core portion I/O bus 82. The output data from the intermediate buffer 83 is supplied to an output buffer 85 through an intermediate bus 84. Readout data Dout is output from the output buffer 85 to an external device.

As shown in the timing chart of FIG. 2, the ATD 86 detects a change in an input address Add, generates a pulse signal Pa having a predetermined pulse width and supplies it to the intermediate buffer 83 and the output buffer 85. The intermediate buffer 83 transmits data from the core portion I/O bus 82 to the intermediate bus 84 under control of the pulse signal Pa. The output buffer 85 externally transmits the data output from the intermediate bus 84 as Dout under control of the pulse signal Pa.

In order for the semiconductor memory device with the above arrangement to perform a high-speed data read operation, ATD 86 must be as sensitive as possible.

In the semiconductor memory device, the speed of a read operation and the number of bits of a multibit output have increased. Therefore, ATD 86 must be sensitive in order to achieve a high-speed operation. A buffer having a large current supply capacity is required as the output buffer 85. In addition, in multibit output data, a ratio di/dt of a change in output current to a change in time for a change in output of the output buffer 85 is significantly increased.

FIG. 3 is a circuit diagram showing a wiring state around a chip when the above memory device is constituted by a one-chip memory. A plurality of input/output pins are arranged on a memory chip 91. However, in order to simplify the following description, only a Vcc pin for supplying a high source potential Vcc and a Vss pin for supplying a ground potential Vss are shown in FIG. 3. The Vcc and Vss pins are connected to a power source through the wiring on a circuit board. An inductance component L is parasitically present in the wiring. Symbol C in FIG. 3 denotes a capacitor for connecting Vcc to Vss.

In the circuit shown in FIG. 3, when di/dt is increased, an electromotive force $\phi(\phi = L\, di/dt)$ is also increased, thereby significantly changing the ground potential Vss of the chip. Using an ATD 86 having high sensitivity, the change in the ground potential Vss due to the change in output is directly detected. As a result, as shown in the timing chart of FIG. 4, the ATD 86 generates subsequent pulse signal Pa. The output buffer 85 is operated again by the subsequent pulse signal Pa to reset the output or to change the output data to the opposite logic level within a short time, thereby significantly changing the ground potential Vss again. As a result, as shown in FIG. 4, the output oscillates, and a normal read out operation cannot be assured.

Typically, as a countermeasure to these problems, sizes of transistor elements constituting the output buffer 85 are decreased, or the sensitivity of the ATD 86 is degraded. However, both methods are in conflict with a high-speed read operation.

As described above, according to a conventional semiconductor memory device, when a sensitive ATD is used to increase a read operation speed, a normal operation cannot be assured because of a change in power source potential caused by a change in output of the memory device.

SUMMARY OF THE INVENTION

The present invention has been made in consideration of the above drawbacks, and has as its object to provide a semiconductor memory device capable of providing a high-speed read out operation and assuring a normal operation.

A semiconductor memory device of the present invention comprises a first pulse generator for generating a first pulse signal in response to a change in an address signal, a low-pass filter for receiving the address signal, a second pulse generator for generating a second pulse signal in response to a change in an output signal of the low-pass filter, and a controller means for performing a read operation of data from the memory cells up to (for example, a point on the read path intermediate between the memory cells and an output of the semiconductor memory device) a halfway point of a read path in response to the first pulse signal and controlling an operation for reading out the data to an external device in response to the second pulse signal.

The semiconductor memory device according to another aspect of the present invention comprises a first pulse generator for generating a first pulse signal in response to a change in an address signal, a second pulse generator, including a low-pass filter for receiving the address signal, for generating a second pulse signal in response to a change in a output signal from the low-pass filter, and a controller means for performing a read operation of data from the memory cells in a first portion of the read path up to a halfway point of a read path (for example, a point on the read path intermediate between the memory cells and an output of the semiconductor memory device) in response to the first pulse signal and controlling an operation for reading out the data in a second portion of the read path to an external device in response to the second pulse signal.

The low-pass filter removes noise generated by a change in power source potential caused by a change in the output and detected as an apparent change in the address signal by the ATD. Therefore, the pulse signal is not generated from the second pulse generator. In this situation, since the second pulse is not generated, the output buffer is not erroneously operated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 5 is a block diagram showing an arrangement according to an embodiment of the present invention;

FIGS. 7 to 10 are circuit diagrams showing arrangements of different circuit portions on the semiconductor memory device according to the embodiment shown in FIG. 5; and FIG. 11 is a timing chart showing an operation of the circuit shown in FIG. 10.

DETAILED DESCRIPTION OF THE PREFERRED EMBODIMENTS

Figure 1:
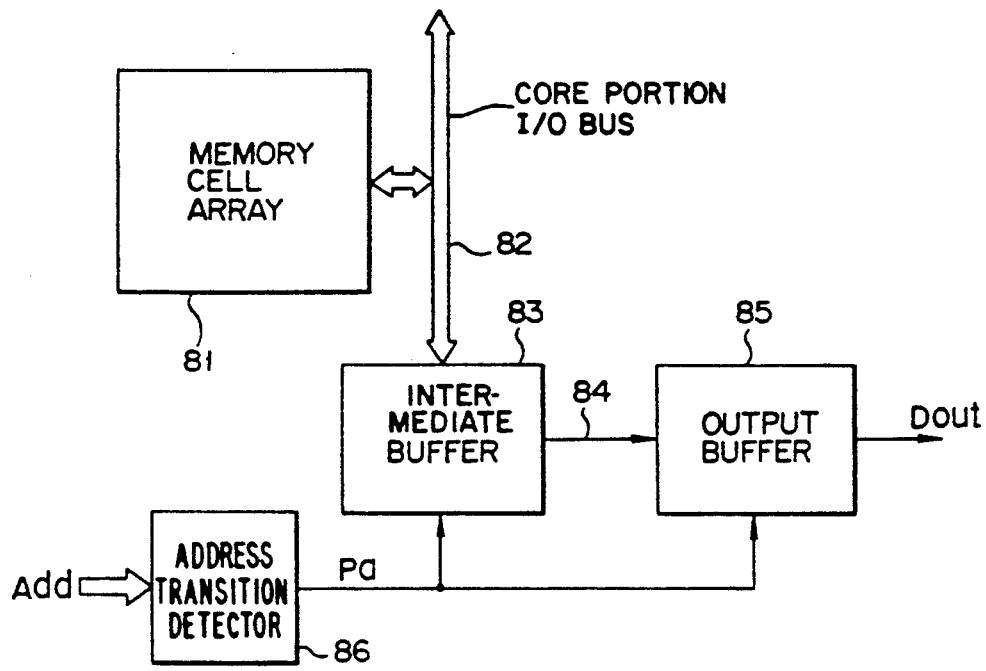
FIG. 1 is a block diagram showing a schematic arrangement of a data read portion of a conventional semiconductor memory device.
Figure 2:
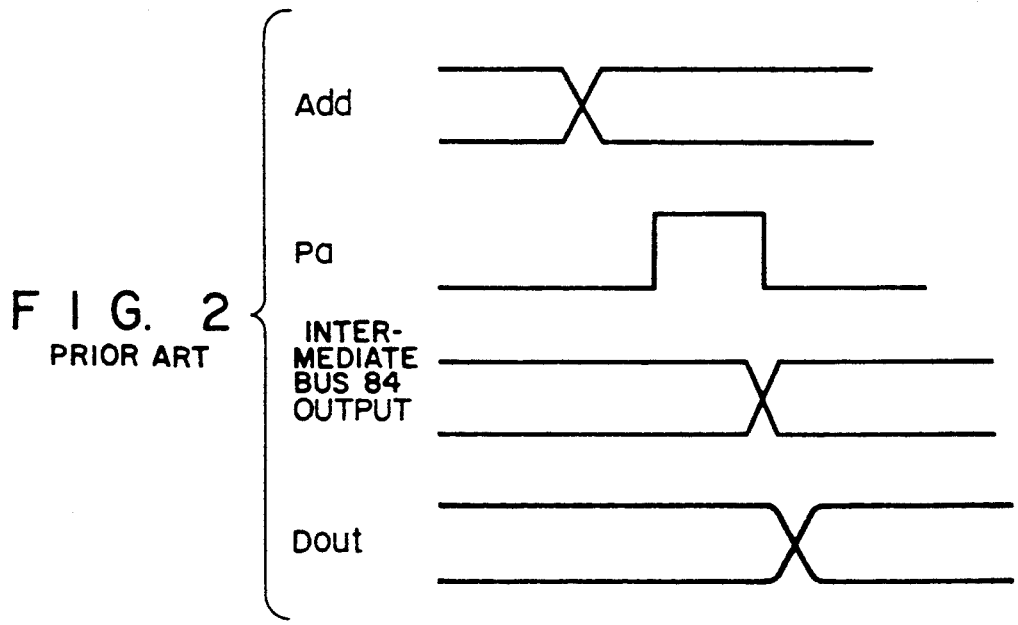
FIG. 2 is a timing chart showing an operation of the semiconductor memory device in FIG. 1.
Figure 3:
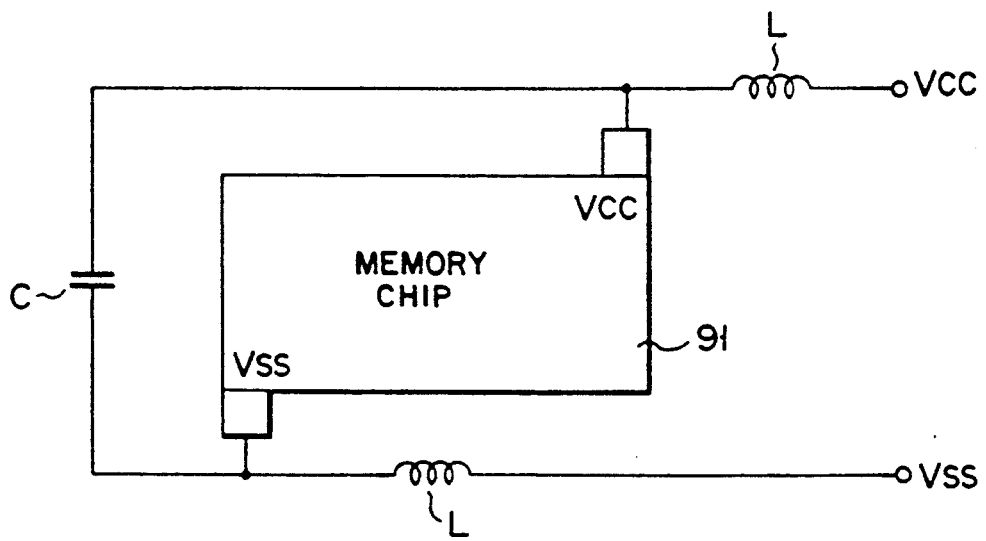
FIG. 3 is a circuit diagram showing a wiring around a chip when the semiconductor memory device in FIG. 1 is constituted by a one-chip memory.
Figure 4:
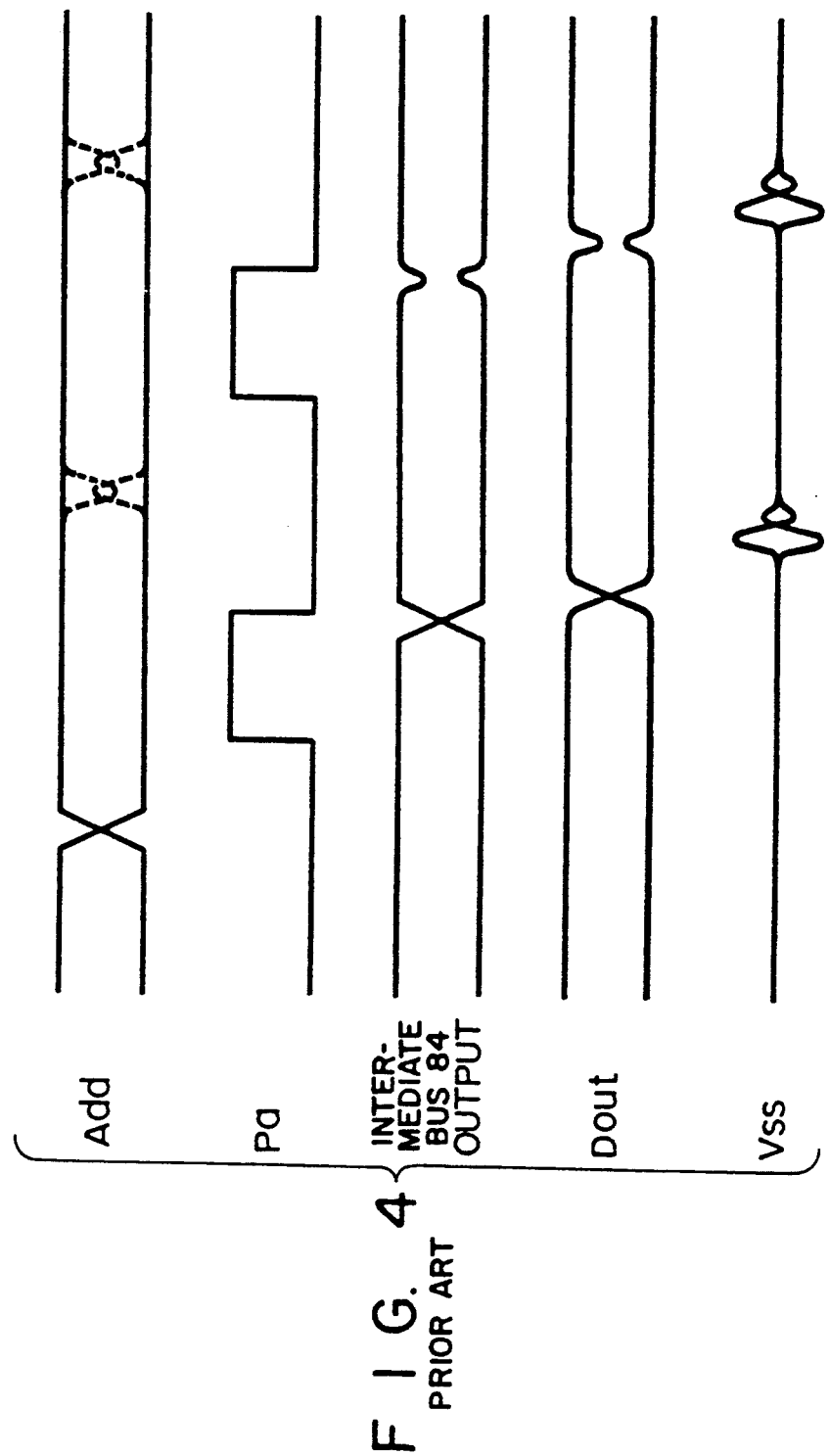
FIG. 4 is a timing chart showing an operation of the circuit shown in FIG. 3.

According to the present invention, a static semiconductor memory device or a dynamic semiconductor memory device having a static column mode is basically arranged as follows. A change in address signal Add is detected by an address transition detector ATD to generate two read control pulse signals, and an operation for reading out data from a memory cell array and outputting the data through an output buffer is controlled using the two read control pulses. Usually, the two read control pulses are respectively generated from two address transition detectors ATDs. There are two readout control methods using the two read control pulse signals. In the first method, the first read control pulse signal controls an entire read path extending from the memory cell array to an external device, i.e., through a core portion I/O bus, an intermediate buffer, an intermediate bus and an output buffer, and the second read control pulse signal determines whether the data passes at the halfway point of this read path or not. According to the second method, the first read control pulse controls up to the halfway point of the above-described read path, e.g., the first half, and the second read control pulse sequentially controls the rest of the read path, e.g., the second half of the above-described read path, thereby sharing the control of the entire read path.

An embodiment of the present invention will be described below with reference to the accompanying drawings.

FIG. 5 is a block diagram showing a schematic arrangement of a data read portion of the semiconductor memory device according to an embodiment of the present invention. Data is stored in memory cell array 11 using well-known techniques. Data read out from a memory cell array 11 is supplied to an intermediate buffer 13 through a core portion I/O bus 12. The output data from the intermediate buffer 13 is supplied to an output buffer 15 through an intermediate bus 14, and readout data Dout is output from the output buffer 15 to the external device. Thus, the readout data is obtained.

An address Add is simultaneously supplied to a first ATD (address transition detector) 16 and a low-pass filter 17. The first ATD 16 detects a change in input address Add and generates a pulse signal P1 having a predetermined pulse width. The pulse signal P1 generated from the first ATD 16 is supplied to the intermediate buffer 13. Operation of the intermediate buffer 13 is controlled by pulse signal P1. The low-pass filter 17 removes noise having a high-frequency component from the input address Add. The signal passing through the low-pass filter 17 is supplied to a second ATD 18. The second ATD 18 detects a change in input signal and generate a pulse signal P2 having a predetermined width. The pulse signal P2 generated by the second ATD 18 is converted into a pulse signal P2a having a predetermined pulse width and is then supplied to the output buffer 15. Operation of the output buffer 15 is controlled by the pulse signal P2a.

Note that, in order to increase an operation speed, a sensitive detector is used as the first ATD 16, and a buffer having a large current supply capacity is used as the output buffer 15.

An operation of the circuit with the above arrangement is described below with reference to a timing chart in FIG. 6.

The address Add is first changed, and data is read from the memory cell array 11 to the core portion I/O bus 12 in response to the address. After a predetermined period of time after the address Add was changed, a first pulse signal P1 is generated from the first ATD 16. The pulse signal P1 is, input to operate the intermediate buffer 13, and data on the core portion intermediate bus 12 is transmitted to the intermediate bus 14. In addition, after the lapse of the predetermined period of time from when the address Add is changed, the pulse signal P2 is generated by the second ATD 18. Thereafter, a pulse signal P2 is converted into a pulse signal P2a by a pulse width setting circuit 19. By receiving the pulse signal P2a, the output buffer 15 is operated. The data on the intermediate bus 14 is output to an external device as output data Dout.

Figure 6:
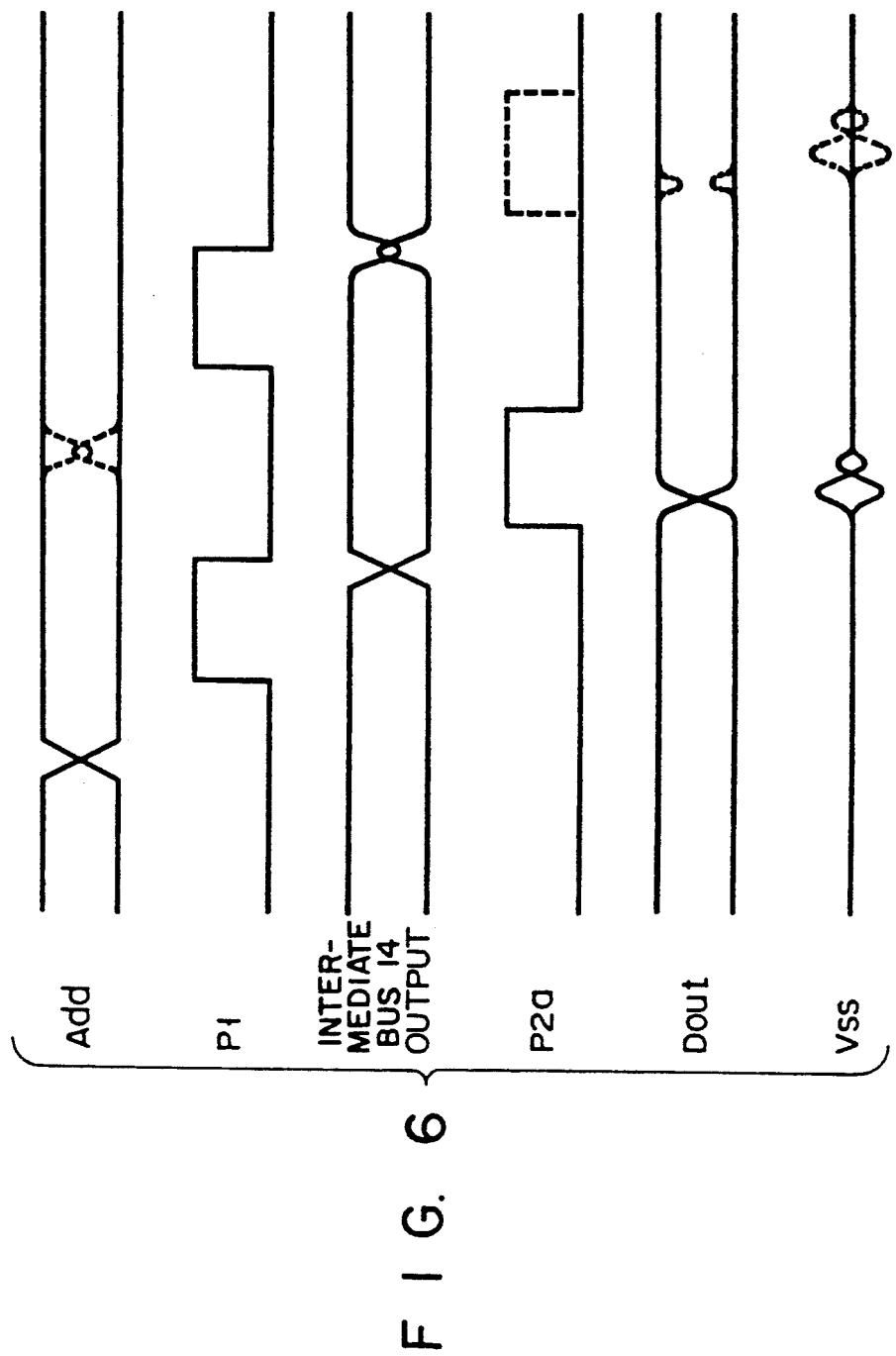
FIG. 6 is a timing chart showing an operation of the semiconductor memory device shown in FIG. 5.

As described above, since a buffer having a large current supply capacity is used as the output buffer 15, when the output buffer 15 is operated to output the output data Dout to the external device, noise may be generated on ground potential Vss as shown in FIG. 6. Due to generation of the noise on ground potential Vss, the address Add appears to change as shown in FIG. 6. The apparent change is detected by the first ATD 16, and the first pulse signal P1 is generated. Therefore, since the intermediate buffer 13 is operated, the data of the intermediate bus 14 is momentarily changed, as shown in FIG. 6. However, since the noise included in the address Add is removed by the low-pass filter 17, no pulse signal is generated by the second ATD 18. Therefore, no pulse signal P2a is generated, and an oscillation state does not occur, unlike a conventional device.

According to the above described embodiment, the device is protected from noise without delaying access time. In order to increase the operation speed, a sensitive detector is used as the first ATD 16. The second ATD 18 need not be highly sensitive. However, when sensitivity of the second ATD 18 is poor, an output operation of data from the output buffer 15 is delayed, thereby delaying access time. About 10 nanoseconds of time are required to read out data onto the intermediate bus 14 by the intermediate buffer 13 under control of the first pulse signal P1. The low-pass filter 17 removes noise having a pulse width of several nanoseconds or less. For this reason, even if a change in an address passing through the low-pass filter 17 is detected by the second ATD 18 and a pulse signal P2 is generated, data having a sufficient margin can be output from the output buffer 15 to the external device.

FIG. 7 is a circuit diagram showing an arrangement of the low-pass filter 17 in the semiconductor memory device according to the above embodiment. This circuit comprises two p-channel MOS transistors 22 and 23 inserted in series between a power source potential Vcc and an output node 21, two n-channel MOS transistors 24 and 25 inserted in series between the output node 21 and a ground potential Vss, and a signal delay circuit 26 for delaying a 1-bit address signal Add by a predetermined time. The 1-bit address signal Add is directly supplied to each of the gates of the transistors 22 and 24, and the 1-bit address signal Add is supplied to each of the gates of the transistors 23 and 25 through the signal delay circuit 26.

In the low-pass filter 17 with the above arrangement, when the input address signal Add changes from "0" to "1", the transistor 24 is immediately turned on. The transistor 25 is turned on after the output signal from the signal delay circuit 26 changed to "1". As a result, when the input address signal Add changes from "0" to "1", the signal from the output node 21 changes from "1" to "0" with a delay time of the signal delay circuit 26.

FIG. 8 is a circuit diagram showing a detailed arrangement of the first ATD 16 in the semiconductor memory device according to the above embodiment. The second ATD 18 has the same arrangement as the first ATD 16, and only an input stage of the ATD 18 is different from that of the ATD 16. This circuit comprises p-channel MOS transistor 32 having a drain-source path connected between a power source potential Vcc and a node 31, two n-channel MOS transistors 33 and 34 having their drain-source paths connected in series between the node 31 and a ground potential Vss, two n-channel MOS transistors 35 and 36 having their drain-source paths connected in series between the node 31 and the ground potential Vss, a signal delay circuit 37 for delaying a 1-bit address signal Add by a predetermined time, an inverter 38 for inverting an output signal from the signal delay circuit 37, an inverter 39 for inverting the 1-bit address signal Add, a signal delay circuit 40 for delaying an output signal from the inverter 39 by a predetermined time, an inverter 41 for inverting an output signal from the signal delay circuit 40, and an inverter 42 for receiving a signal of the node 31.

The p-channel MOS transistor 32 serves as a load MOS transistor. The gate of transistor 32 is connected to the ground potential Vss and normally set in an ON state. The address signal Add is directly supplied to the gate of the n-channel MOS transistor 33, and an output signal from the inverter 38 is supplied to the gate of the n-channel MOS transistor 34. An output signal from the inverter 39 is supplied to the gate of the n-channel MOS transistor 35, and an output signal from the inverter 41 is supplied to the gate of the n-channel MOS transistor 36. A pulse signal P1 is output from the inverter 42.

In the above arrangement, when the input address signal Add is stable and at "0", the transistor 33 is set in an OFF state; the transistor 34, an ON state; the transistor 35, an ON state; and the transistor 36, an OFF state. There is no current path for discharging the node 31 to a ground potential, and the node 31 is set to be "1" by the transistor 32. Therefore, a pulse signal serving as the output from the inverter 42 is set to be "0". When the signal Add changes to "1", the transistor 33 is immediately turned on. However, since the transistor 34 is still set in an ON state, a current path is formed through both the transistors 33 and 34 for discharging the node 31 to the ground potential, thereby changing the signal from the node 31 to "0". Thereafter, the pulse signal P1 serving as the output from the inverter 42 rises to "1". When the output signal is changed from "0" to "1" with a delay time of the signal delay circuit 37, the transistor 34 set in an ON state is turned off. Therefore, the node 31 is set to be "1" by the transistor 32 again, and the pulse signal P1 returns to "0" again. Thus, the change in input address signal Add from "0" to "1" is detected, thereby generating the pulse signal P1.

When the input address signal Add is stable and at "1", the transistor 33 is set in an ON state, the transistor 34, an OFF state; the transistor 35, an OFF state; and the transistor 36, an ON state. In this case, there is no current path for discharging the node 31 to the ground potential, and the node 31 is set to be "1" by the transistor 32. When the signal Add goes to "0", the transistor 35 is immediately turned on. However, since the transistor 36 is still set in an ON state, a current path is formed through both the transistors 35 and 36 for discharging the node 31 to the ground potential, thereby changing the signal from the node 31 to "0". When an output signal from the signal delay circuit 40 is changed from "0" to "1" with its delay time, the transistor 34 is turned off. Therefore, the node 31 is set to be "1" by the transistor 32 again. Thus, the change in input address signal Add from "1" to "0" is detected, thereby generating the pulse signal P1.

Note that the width of the pulse signal P1 is determined according to each delay time of the signal delay circuits 37 and 40.

FIG. 9 is a circuit diagram showing an arrangement of the intermediate buffer 13 in the semiconductor memory device according to the above embodiment. This circuit comprises two p-channel MOS transistors 53 and 54 respectively inserted between a power source potential Vcc and a pair of nodes 51 and 52 connected to a pair of buses I/Oc and $\overline{I/Oc}$ in the core portion I/O bus 12, a p-channel MOS transistor 55 inserted between the pair of nodes 51 and 52, a p-channel MOS transistor 56 inserted between the power source potential Vcc and the node 51 of the pair of nodes, a p-channel MOS transistor 57 inserted between the power source potential Vcc and the node 52, an n-channel MOS transistor 59 inserted between the node 51 and a node 58, an n-channel MOS transistor 60 inserted between the node 52 and the node 58, an n-channel MOS transistor 61 inserted between the node 58 and a ground potential Vss, an inverter 62 for inverting a pulse signal P1 generated by the first ATD 16, a buffer circuit 63 for receiving the signal from the node 51 of the pair of nodes, and a buffer circuit 64 for receiving a signal from the node 52.

Each of the gates of transistors 56 and 59 is connected to the node 52, and each of the gates of the transistors 57 and 60 is connected to the node 51. An equalizing signal $\overline{EQ}$ serving as an output signal from the inverter 62 is supplied to each of the gates of the transistors 53, 54, 55 and 61.

In the above arrangement, when a first pulse signal P1 generated by the first ATD 16 changes from "0" to "1", the equalizing signal $\overline{EQ}$ serving as an output signal from the inverter 62 changes from "1" to "0" and each of the transistors 53, 54 and 55 is turned on. By turning the transistors 53 and 54 on, the pair of nodes 51 and 52, i.e., the pair of buses I/Oc and $\overline{I/Oc}$, are precharged by the power source potential Vcc. By turning the transistor 55 on, the pair of buses I/Oc and $\overline{I/Oc}$ are equalized to the same potential. When the pulse signal P1 changes to "0", each of the transistors 53, 54 and 55 is turned off and the transistor 61 is turned on. By turning the transistor 61 on, a CMOS cross-coupled latch, constituted by the p-channel MOS transistors 56 and 57 and the n-channel MOS transistors 59 and 60, is operated to start amplification of a potential difference of data read out on to the pair of buses I/Oc and $\overline{I/Oc}$. Therefore, complementary data of the pair of nodes 51 and 52 is generated. Thereafter, the data is read out onto a bus (such as 14) by the buffer circuits 63 and 64.

FIG. 10 is a circuit diagram showing an arrangement of the pulse width setting circuit 19 in the semiconductor memory device according to the above embodiment. FIG. 11 is a timing chart illustrating an operation of the pulse width setting circuit 19. This circuit comprises an inverter 71 for obtaining a signal $\overline{P2}$ by inverting the second pulse signal P2 generated by the second ATD 18, a signal delay circuit 72 for obtaining a delay signal P3 by delaying the output signal from the inverter 71 by a predetermined time, an inverter 73 for obtaining a signal $\overline{P3}$ by inverting the output signal from the signal delay circuit 72, a NAND gate 74 for receiving an output signal from the inverter 73 and the output signal from the inverter 71, and an inverter 75 for inverting an output signal P4 from the NAND gate 74. A pulse signal P2a can be obtained as an output signal from the inverter 75.

In the pulse width setting circuit with the above arrangement, regardless of the pulse width of the input pulse signal P2, the pulse width is determined by a signal delay time of the signal delay circuit 72.

As described above, according to the present invention, there is provided a semiconductor memory device capable of providing a high-speed operation and assuring a normal operation.

Additional advantages and modifications will readily occur to those skilled in the art. Therefore, the invention in its broader aspects is not limited to the specific details, representative devices shown and described herein. Accordingly, various modifications may by without departing from the spirit or scope of the general inventive concept as defined by the appended claims and their equivalents.

What is claimed is:

1. A semiconductor device for controlling transmission of data over an output signal path, the data being read from a memory cell array and output to an external device, the output signal path being between the memory cell array and an output buffer, the device comprising:
   first pulse generating means for receiving an address signal for addressing memory cells in the memory cell array, and for generating a first signal pulse in response to a change in the address signal;
   filter means for receiving the address signal, and for outputting a filtered address signal;
   second pulse generating means, coupled to the filter means, for generating a second signal pulse in response to a change in the filtered address signal; and
   control means, coupled to the first and second pulse generating means, for controlling the transmission of the data over the output signal path from the memory cell array to the output buffer in response to the first signal pulse, and for controlling the output of the data from the output buffer to the external device in response to the second signal pulse.

2. The semiconductor device according to claim 1, wherein the filter means is a low pass filter.

3. A semiconductor device for controlling transmission of data over an output signal path, the data being read from a memory cell array and output to an external device, the output signal path being between the memory cell array and an output buffer and having a first portion and a second portion, the first portion of the output signal path being between the memory cell array and a first buffer, the second portion of the output signal path being between the first buffer and the output buffer, the device comprising:
   first pulse generating means, responsive to a change in an address signal for address in the memory cell array, for generating a first signal pulse;
   low-pass filter means for receiving the address signal and for generating a low-pass filter address signal;
   second pulse generating means, responsive to a change in the filtered address signal, for generating a second signal pulse; and
   control means for controlling the first buffer to transmit to transmit the data from the memory cell array to the output buffer in response to the first signal pulse, and for controlling the output buffer to transmit the data to the external device in response to the second signal pulse.

4. A method of controlling transmission of data over an output signal path, the data being read from a memory array and output to an external device, the output signal path being between the memory array and an output buffer, the method comprising the steps of:
   detecting a change in an address signal addressing the memory array for reading data in the memory array;
   controlling the transmission of data read from the memory array over the output signal path from the memory array to the output buffer in response to the detected change in the address signal;
   filtering the address signal to produce a filtered address signal;
   detecting a change in the filtered address signal; and
   controlling the output buffer to transmit the data to an external device in response to the detected change in the filtered address signal.

5. The method according to claim 4, wherein the step of filtering the address signal includes removing high-frequency components of the address signal.

6. A method of controlling transmission of data over an output signal path, the data being read from a memory array and output to an external device, the output signal path being between the memory array and an output buffer and having a first portion and a second portion, the first portion of the output signal path being between the memory array and a first buffer, the second portion of the output signal path being between the first and the output buffer, the method comprising the steps of:

detecting a change in an address signal addressing the memory array for reading data in the memory array;

controlling the first buffer to transmit the data to the output buffer in response to the detected change in the address signal;

filtering the address signal to produce a filtered address signal;

detecting a change in the filtered address signal; and controlling the output buffer to transmit the data to an external device in response to the detected change in the filtered address signal.

7. The method according to claim 6, wherein the step of controlling the first buffer to transmit the data to the output buffer includes generating a first address change signal pulse.

8. The method according to claim 7, wherein the step of controlling the output buffer to transmit the data to the external device includes generating a second address change signal pulse.

9. The method according to claim 8, wherein the step of filtering the address signal includes removing high-frequency components of the address signal.

* * * * *